(12) United States Patent
Naono

(10) Patent No.: US 11,477,580 B2
(45) Date of Patent: Oct. 18, 2022

(54) PIEZOELECTRIC MICROPHONE CHIP AND PIEZOELECTRIC MICROPHONE

(71) Applicant: FUJIFILM CORPORATION, Tokyo (JP)

(72) Inventor: Takayuki Naono, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 398 days.

(21) Appl. No.: 16/669,515

(22) Filed: Oct. 31, 2019

(65) Prior Publication Data

US 2020/0112798 A1 Apr. 9, 2020

Related U.S. Application Data

(63) Continuation of application No. PCT/JP2018/016052, filed on Apr. 18, 2018.

(30) Foreign Application Priority Data

May 9, 2017 (JP) .............................. JP2017-092960

(51) Int. Cl.
*H04R 17/02* (2006.01)
*H01L 41/053* (2006.01)
(Continued)

(52) U.S. Cl.
CPC ............ *H04R 17/02* (2013.01); *H01L 41/053* (2013.01); *H01L 41/113* (2013.01); *H04R 1/06* (2013.01)

(58) Field of Classification Search
CPC ........ H04R 3/00; H04R 3/005; H04R 23/004; H04R 19/04; H04R 19/016; H04R 17/005;
(Continued)

(56) References Cited

U.S. PATENT DOCUMENTS

2007/0047746 A1 3/2007 Weigold et al.
2012/0087522 A1 4/2012 Lee et al.
(Continued)

FOREIGN PATENT DOCUMENTS

JP S63-134563 A 6/1988
JP 2012-242398 A 12/2012
(Continued)

OTHER PUBLICATIONS

Extended European Search Report dated Mar. 4, 2020, issued in corresponding EP Patent Application No. 18798276.4.
(Continued)

*Primary Examiner* — Ahmad F. Matar
*Assistant Examiner* — Sabrina Diaz
(74) *Attorney, Agent, or Firm* — Solaris Intellectual Property Group, PLLC

(57) ABSTRACT

The piezoelectric microphone chip includes a single thin plate, a diaphragm support structure that is provided on one surface of the thin plate and includes an outer edge support portion that supports an outer edge of the thin plate and a separation support portion that separates the thin plate into a plurality of diaphragms in association with the outer edge support portion, a single or a plurality of piezoelectric conversion portions formed by laminating a first electrode, a piezoelectric film, and a second electrode sequentially from a diaphragm side on each of the diaphragms, and a signal detection circuit that detects outputs from the piezoelectric conversion portions provided on the plurality of diaphragms, and a relationship among a thickness $t_1$ of the outer edge support portion, a thickness $t_2$ of the separation support portion, and a thickness td of the thin plate 10 is set to $13.3 \times td < t_2 < t_1 - 20$ μm.

4 Claims, 15 Drawing Sheets

(51) Int. Cl.
*H01L 41/113* (2006.01)
*H04R 1/06* (2006.01)

(58) Field of Classification Search
CPC ...... H04R 17/00; H04R 17/02; H04R 17/025; H04R 1/04; H04R 1/005; H04R 1/406; H04R 1/083; H04R 1/086; H04R 1/222; H04R 1/06; H04R 17/10; H04R 21/02; H04R 2499/11; H04R 15/00; H04R 7/045; H01L 41/053; H01L 41/113
USPC .................................. 381/173, 114, 369, 190
See application file for complete search history.

(56) References Cited

U.S. PATENT DOCUMENTS

| | | |
|---|---|---|
| 2012/0297884 A1 | 11/2012 | Gamage et al. |
| 2012/0306316 A1 | 12/2012 | Nakamura et al. |
| 2012/0319529 A1 | 12/2012 | Nakazawa et al. |
| 2014/0050338 A1* | 2/2014 | Kasai ................... H04R 31/006 381/174 |
| 2015/0082901 A1 | 3/2015 | Fuji et al. |

FOREIGN PATENT DOCUMENTS

| | | | | |
|---|---|---|---|---|
| JP | 2012-253405 A | 12/2012 | | |
| JP | 2013-5137 A | 1/2013 | | |
| JP | 2017-22576 A | 1/2017 | | |
| WO | WO-2015064423 A1 * | 5/2015 | ......... | H01L 41/0805 |
| WO | 2016/107975 A1 | 7/2016 | | |
| WO | WO-2016107975 A1 * | 7/2016 | ......... | H01L 41/0973 |

OTHER PUBLICATIONS

International Search Report issued in International Application No. PCT/JP2018/016052 dated Jul. 3, 2018.
Written Opinion of the ISA issued in International Application No. PCT/JP2018/016052 dated Jul. 3, 2018.

* cited by examiner

PIEZOELECTRIC MICROPHONE CHIP AND PIEZOELECTRIC MICROPHONE

CROSS-REFERENCE TO RELATED APPLICATIONS

This application is a continuation application of International Application No. PCT/JP2018/016052, filed Apr. 18, 2018, the disclosure of which is incorporated herein by reference in its entirety. Further, this application claims priority from Japanese Patent Application No. 2017-092960, filed May 9, 2017, the disclosure of which is incorporated herein by reference in its entirety.

BACKGROUND OF THE INVENTION

1. Field of the Invention

The present invention relates to a piezoelectric microphone chip including a piezoelectric element as a sensor and a piezoelectric microphone including the chip and particularly to a microelectromechanical systems (MEMS) piezoelectric microphone chip that is produced using a semiconductor integrated circuit production technique and a piezoelectric microphone.

2. Description of the Related Art

In recent years, small-sized microphones having a high SN ratio have been demanded, and MEMS microphones have been drawing attention as a solution to the above-described demand. Particularly, for MEMS piezoelectric microphones using a piezoelectric effect, a broader range of applications than those of electrostatic type in the related art are expected due to the unnecessity of a driving bias voltage, the broad dynamic range of displacement, and the like.

As a structure in the related art for detecting the sound pressure of the MEMS piezoelectric microphone, a diaphragm structure is exemplified. A microphone in the related art is configured of a single diaphragm structure configured of one cavity and an oscillation film that coats the cavity and a piezoelectric element on the diaphragm structure. A microphone chip including a single diaphragm structure is disposed in a package. Due to the single diaphragm structure, element parameters such as resonant frequency and sensitivity are determined by the thickness of the oscillation film and the size and shape of the diaphragm, and the degree of freedom is small. Therefore, the microphone was not capable of coping with an additional sensitivity need.

As a piezoelectric sensor that is used as an ultrasonic transducer, a piezoelectric sensor including a piezoelectric element group in which piezoelectric elements are respectively provided on a plurality of diaphragm structures disposed in an array shape in order to generate ultrasonic images is known (JP2013-005137A, JP2012-253405A, and the like). In JP2013-005137A and JP2012-253405A, a configuration in which several piezoelectric elements in the piezoelectric element group are connected in series and receiving sensitivity is improved by adding detection signals is proposed.

SUMMARY OF THE INVENTION

Between microphones that detect sound waves in human audibility zone and ultrasonic transducers that are used in probes for ultrasonic image diagnoses and the like, demanded specifications such as detection sensitivity and the size of packages are different. For microphones, additional size reduction is demanded, and there is a need for increasing the conversion efficiency from a sound pressure to an electric signal per element area. In addition, as MEMS piezoelectric microphone chips, a sensitivity that is not decreased by the mounting in a package and the easiness in packaging are demanded.

An object of the present invention is to provide a piezoelectric microphone chip that has a high sensitivity of sound pressure detection signals and is suitable for being mounted in a package and a piezoelectric microphone including the piezoelectric microphone chip.

A piezoelectric microphone chip of the present invention comprises
a single thin plate;
a diaphragm support structure that is provided on one surface of the thin plate and includes an outer edge support portion that supports an outer edge of the thin plate and a separation support portion that separates the thin plate into a plurality of diaphragms in association with the outer edge support portion;
a single or a plurality of piezoelectric conversion portions formed by laminating a first electrode, a piezoelectric film, and a second electrode sequentially from a diaphragm side on each of the diaphragms; and
a signal detection circuit that detects outputs from the piezoelectric conversion portions provided on the plurality of diaphragms, and
a relationship among a thickness $t_1$ of the outer edge support portion, a thickness $t_2$ of the separation support portion, and a thickness td of the thin plate is $13.3 \times td < t_2 < t_1 - 20\ \mu m$.

In the piezoelectric microphone chip of the present invention, the signal detection circuit preferably adds voltage outputs of the respective piezoelectric conversion portions of the plurality of piezoelectric conversion portions and detects a signal.

In the piezoelectric microphone chip of the present invention, it is preferable that in a case where the voltage outputs of at least two piezoelectric conversion portions among the plurality of piezoelectric conversion portions are in the same phase, the signal detection circuit has a conductive wire that electrically connects the second electrode of one of the two piezoelectric conversion portions and the first electrode of the other piezoelectric conversion portion, thereby adding the voltage outputs of the two piezoelectric conversion portions.

In the piezoelectric microphone chip of the present invention, it is preferable that, in a case where the voltage outputs of at least two piezoelectric conversion portions among the plurality of piezoelectric conversion portions are in opposite phases, the signal detection circuit has a conductive wire that electrically connects the first electrode of one of the two piezoelectric conversion portions and the first electrode of the other piezoelectric conversion portion, thereby adding the voltage outputs of the two piezoelectric conversion portions.

In the piezoelectric microphone chip of the present invention, the piezoelectric film is preferably formed of a perovskite-type oxide represented by $Pb(Zr_y, Ti_z, Nb_{1-y-z})O_3$, $0.06 < 1-y-z < 0.14$.

Here, Pb is an A site element in a perovskite structure generally represented by $ABO_3$, and Zr, Ti, and Nb are B site elements. A standard of a molar ratio $Pb:(Zr_y, Ti_z, Nb_{1-y-z}):O$ is 1:1:3, but the molar ratio may deviate in a range in which a perovskite structure can be formed.

A piezoelectric microphone of the present invention is a piezoelectric microphone comprising a package including one sound collection hole; and the piezoelectric microphone chip of the present invention disposed in the package, in which the piezoelectric microphone chip is disposed at a position at which the sound collection hole is surrounded by the outer edge support portion.

The piezoelectric microphone chip of the present invention includes a single thin plate, a diaphragm support structure that is provided on one surface of the thin plate and includes an outer edge support portion that supports an outer edge of the thin plate and a separation support portion that separates the thin plate into a plurality of diaphragms in association with the outer edge support portion, a single or a plurality of piezoelectric conversion portions formed by laminating a first electrode, a piezoelectric film, and a second electrode sequentially from a diaphragm side on each of the diaphragms, and a signal detection circuit that detects outputs from the piezoelectric conversion portions provided on the plurality of diaphragms. Since a sound pressure can be detected using a signal from the plurality of piezoelectric conversion portions provided on the plurality of diaphragms, it is possible to improve S/N. In addition, in a diaphragm support structure, the relationship among a thickness $t_1$ of the outer edge support portion, a thickness $t_2$ of the separation support portion, and a thickness td of the thin plate is $13.3 \times td < t_2 < t_1 - 20$ μm. Therefore, in the case of mounting the microphone chip right above the sound collection hole having a small diameter in the package, a problem with a back cavity being blocked due to slight deviation of alignment is not generated. Therefore, according to the configuration of the piezoelectric microphone chip of the present invention, the sensitivity does not decrease, and it becomes possible to manufacture microphones in a favorable yield.

DESCRIPTION OF THE PREFERRED EMBODIMENTS

Hereinafter, embodiments of a piezoelectric microphone chip and a piezoelectric microphone of an embodiment of the present invention will be described with reference to drawings. The piezoelectric microphone chip of the embodiment of the present invention is a MEMS device.

Figure 1A:
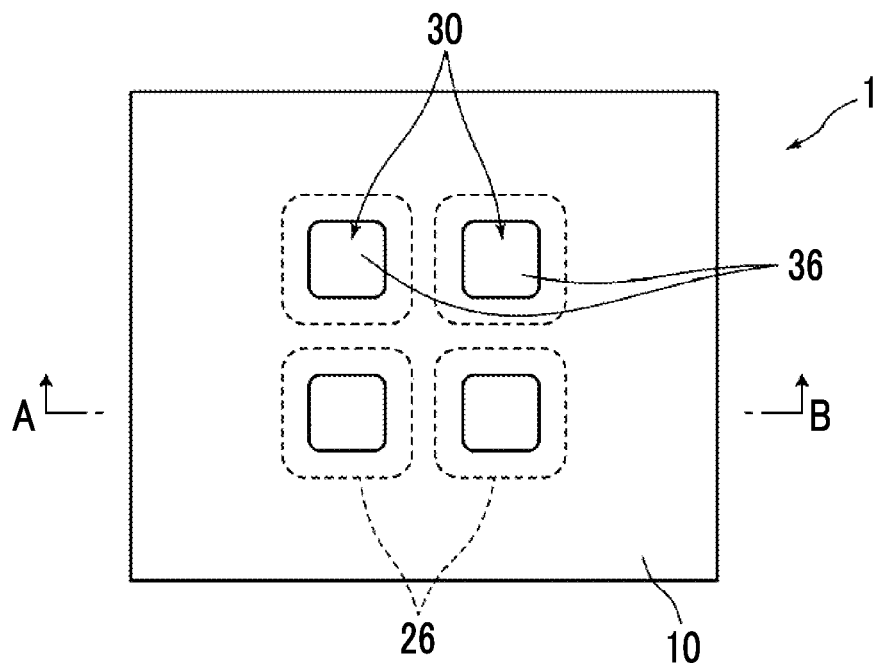
FIG. 1A is a top view of a piezoelectric microphone chip of a first embodiment.
Figure 1B:
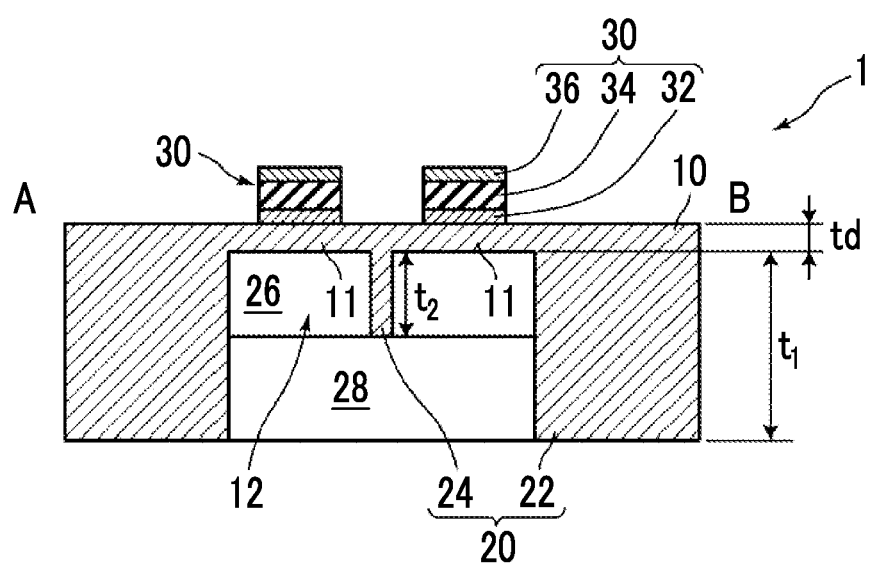
FIG. 1B is a cross-sectional view of the piezoelectric microphone chip of the first embodiment (a cross-sectional view in a direction of an A-B line in FIG. 1A).

FIG. 1A is a top view of a piezoelectric microphone chip 1 of a first embodiment of the present invention. FIG. 1B is a cross-sectional view of the piezoelectric microphone chip 1 shown in FIG. 1A in a direction of an A-B line. In addition, FIG. 1C is a bottom view of the piezoelectric microphone chip 1 shown in FIG. 1A.

Figure 1C:
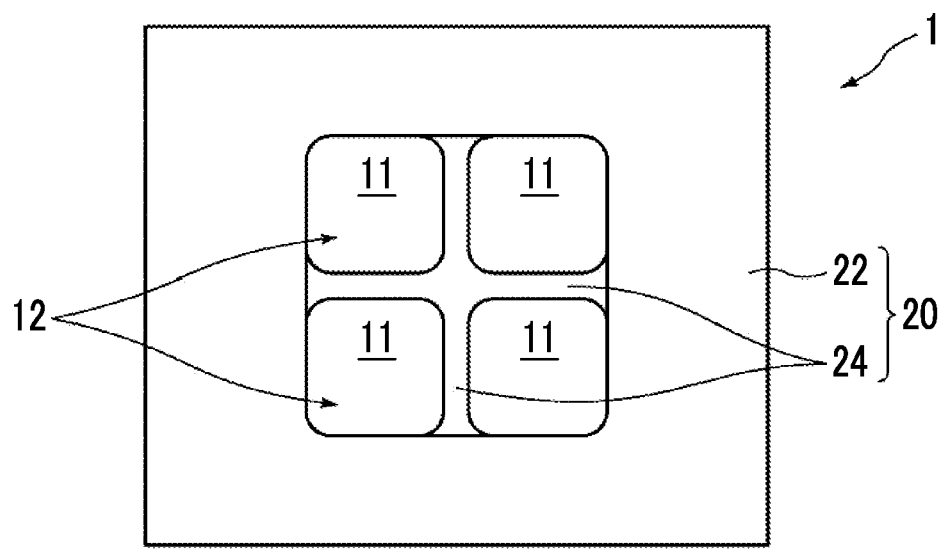
FIG. 1C is a bottom view of the piezoelectric microphone chip of the first embodiment.

As shown in FIGS. 1A, 1B, and 1C, the piezoelectric microphone chip 1 includes a single thin plate 10, a diaphragm support structure 20 that is provided on one surface of the thin plate 10 and includes an outer edge support portion 22 that supports an outer edge of the thin plate 10 and a separation support portion 24 that separates the thin plate 10 into a plurality of diaphragms (oscillation plate) 11 in association with the outer edge support portion 22, and a single or a plurality of piezoelectric conversion portions 30, each including a first electrode 32, a piezoelectric film 34, and a second electrode 36 sequentially laminated from a diaphragm 11 side, on the respective diaphragms 11. Hereinafter, a structure including the diaphragms 11 and the support portions 22 and/or 24 that support the diaphragm 11 will be referred to as a diaphragm structure 12.

Here, in the diaphragm support structure 20, the relationship among a thickness $t_1$ of the outer edge support portion 22, a thickness $t_2$ of the separation support portion 24, and a thickness td of the thin plate 10 (diaphragm 11) is $13.3 \times td < t_2 < t_1 - 20$ μm.

The present piezoelectric microphone chip 1 has a plurality of the diaphragm structures 12 collectively formed by etching from a rear surface of a single silicon substrate. Therefore, the thin plate 10 separated into the plurality of diaphragms 11 and the diaphragm support structure 20 are integrally formed from a single silicon substrate. The piezoelectric conversion portions 30 provided on the respective diaphragms 11 output voltage signals according to sound pressures (pressures) due to a piezoelectric effect. In the present embodiment, four diaphragm structures 12 are provided, but the number of the diaphragm structures 12 provided in a single chip is not particularly limited. The present piezoelectric microphone chip 1 has rear surface cavities 26 in the respective diaphragm structures 12 and a common cavity portion 28 common to all of the diaphragm structures 12. Due to the presence of the common cavity portion 28 having a large volume, it is possible to decrease the influence of an air spring component and increase the sensitivity.

Figure 2:
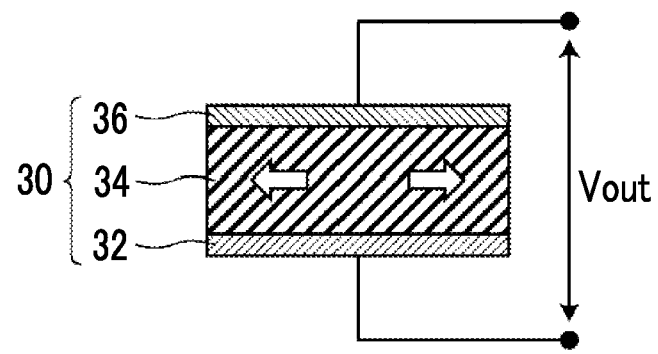
FIG. 2 is a view showing a conceptual view of a piezoelectric conversion output in a piezoelectric conversion portion.

As schematically shown in FIG. 2, the piezoelectric conversion portion 30 has a configuration in which the piezoelectric film 34 is sandwiched between the first electrode 32 and the second electrode 36. A charge that is generated by the application of pressure to the piezoelectric film 34 is output as a voltage output signal $V_{out}$ between the first electrode 32 and the second electrode 36. The above-described serial connection enables the conversion of a charge generated by the piezoelectric effect to a high voltage, and thus a high sensitivity as a transducer can be obtained.

In the present embodiment, a case where one piezoelectric conversion portion 30 is provided on one diaphragm 11 has been described, but a plurality of piezoelectric conversion portions may be provided on one diaphragm 11.

The piezoelectric microphone chip 1 includes a signal detection circuit, not shown, that detects output from the piezoelectric conversion portions 30 provided on the plurality of diaphragms 11. The signal detection circuit is configured to detect a sound pressure applied to the piezoelectric microphone chip 1 using outputs of all of the piezoelectric conversion portions 30 provided in the piezoelectric microphone chip 1. This signal detection circuit has wires that connect the piezoelectric conversion portions 30 in series in order to detect outputs from the plurality of piezoelectric conversion portions 30 by addition.

Since the plurality of diaphragm structures is provided, it is possible to increase the output energy per element area more than a single diaphragm structure in the related art. Therefore, it is possible to increase the sensitivity with respect to sound pressures.

An example of a connection aspect of the piezoelectric conversion portions 30 will be described with reference to FIG. 3A and FIG. 3B.

Figure 3A:
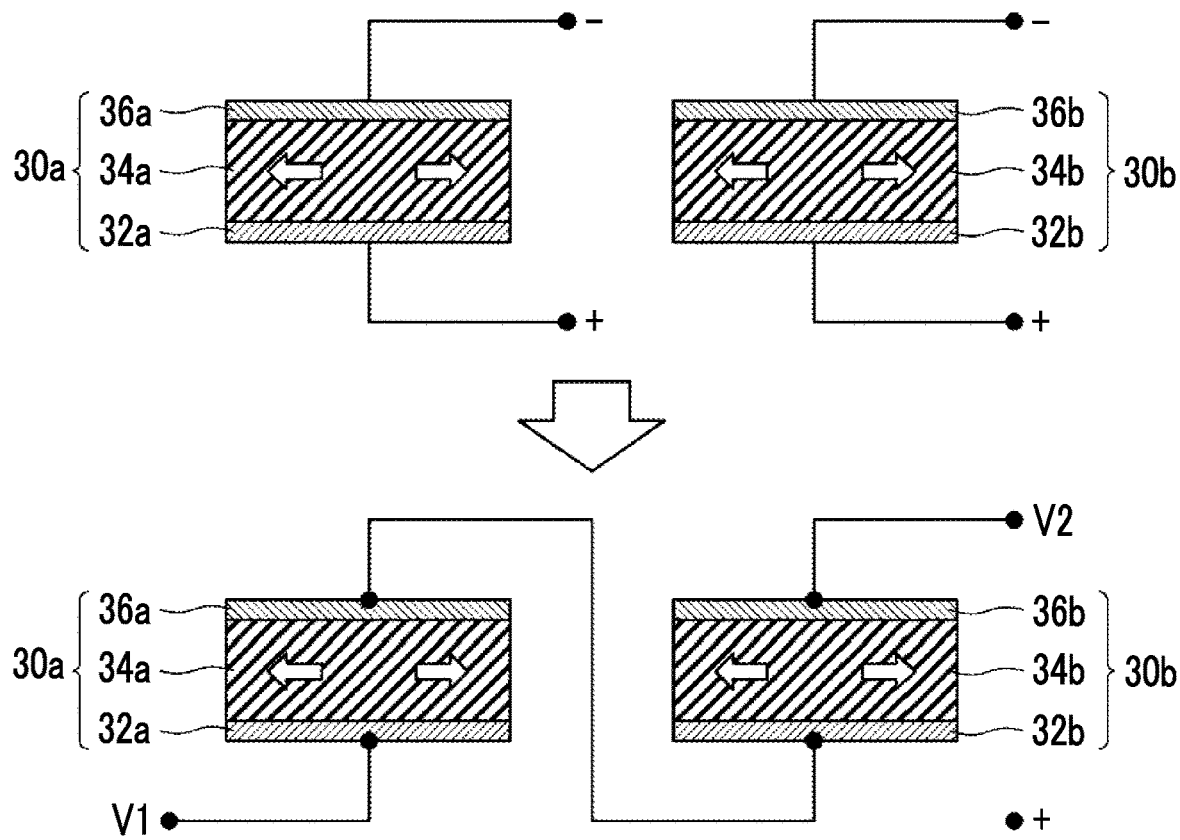
FIG. 3A is a view for describing an example of an electrode connection method in the case of adding voltage outputs of a plurality of piezoelectric conversion portions.

As shown in FIG. 3A, in a case where the outputs of two piezoelectric conversion portions 30a and 30b are in the same phase, a second electrode 36a of one piezoelectric conversion portion 30a is electrically connected to a first electrode 32b of the other piezoelectric conversion portion 30b using a conductive wire. The outputs of two piezoelectric conversion portions 30a and 30b being in the same phase refer to a case where, for example, in a case the piezoelectric conversion portions receive a pressure, a tensile stress is generated in both of the piezoelectric conversion portions, the first electrodes 32a and 32b serve as a positive electrode, and the second electrode 36a and 36b serve as a negative electrode. In this case, due to the above-described electrode connection, the two piezoelectric conversion portions 30a and 30b are connected together in series. In addition, a potential difference V1−V2 between the first electrode 32a of one piezoelectric conversion portion 30a and the second electrode 36b of the other piezoelectric conversion portion 30b becomes an added output voltage.

Figure 3B:
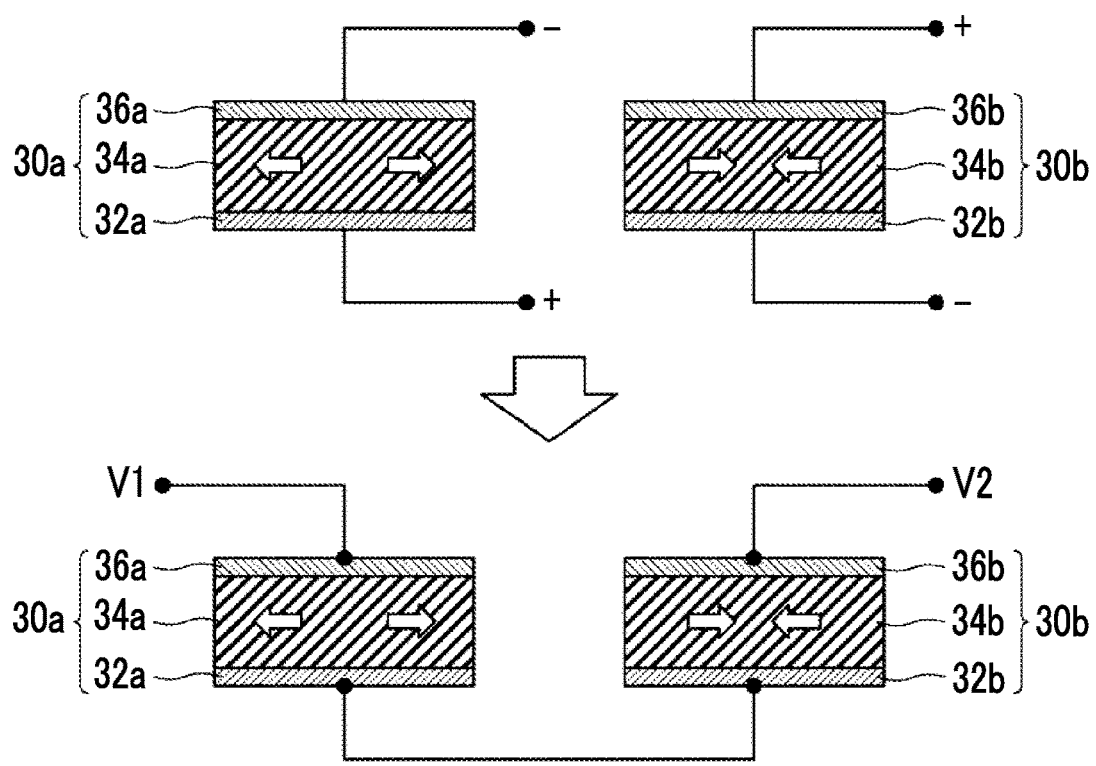
FIG. 3B is a view for describing another example of the electrode connection method in the case of adding the voltage outputs of the plurality of piezoelectric conversion portions.

On the other hand, as shown in FIG. 3B, in a case where the outputs of the two piezoelectric conversion portions 30a and 30b are in opposite phases, for example, the first electrode 32a of one piezoelectric conversion portion 30a is electrically connected to the first electrode 32b of the other piezoelectric conversion portion 30b using a conductive wire. The outputs of two piezoelectric conversion portions 30a and 30b being in opposite phases refer to a case where, for example, in a case the two piezoelectric conversion portions 30a and 30b receive a pressure, in one of the piezoelectric conversion portions, a tensile stress is generated, the first electrodes 32a serves as a positive electrode, and the second electrode 36a serves as a negative electrode; however, in the other piezoelectric conversion portion, a compressive stress is generated, the first electrodes 32b serves as a negative electrode, and the second electrode 36b serves as a positive electrode. In this case, due to the above-described electrode connection, the two piezoelectric conversion portions 30a and 30b are connected together in series. In addition, the potential difference V1−V2 between the second electrode 36a of one piezoelectric conversion portion 30a and the second electrode 36b of the other piezoelectric conversion portion 30b becomes an added output voltage.

In the above description, a method for connecting two piezoelectric conversion portions in series has been described, but three or more piezoelectric conversion portions can also be connected together in series in the same manner. The serial connection adds the outputs of the plurality of piezoelectric conversion portions. As a result, the signal intensity can be increased. Therefore, it becomes possible to improve S/N.

It is also possible to detect signals by connecting a plurality of the piezoelectric conversion portions. In the case of parallel connection, the signal intensity decreases, but the output capacity increases, and thus it is possible to decrease noise. Therefore, consequently, S/N can be improved.

Figure 4:
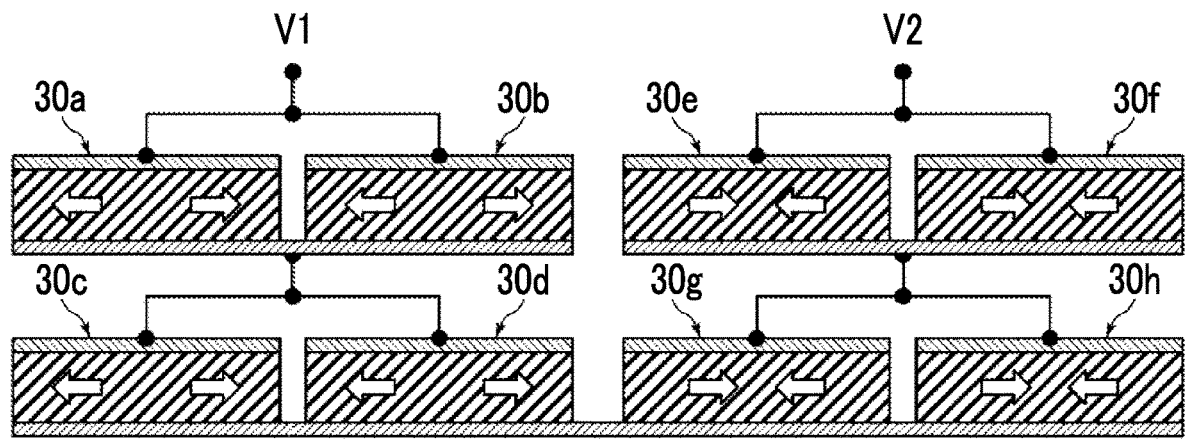
FIG. 4 is a view schematically showing an electrode connection structure of the plurality of piezoelectric conversion portions.

In the case of connecting the piezoelectric conversion portions in series, the signal intensity increases as the number of the piezoelectric conversion portions in serial connection increases. However, the output capacity decreases, and thus noise increases. Therefore, as a signal detection circuit, it is preferable to make the output capacity and the signal intensity appropriate by combining serial connection and parallel connection. FIG. 4 shows an example in which a plurality of piezoelectric conversion portions 30a to 30h are connected to each other by a combination of serial and parallel connections. FIG. 4 shows an aspect in which two sets of the piezoelectric conversion portions connected in parallel are connected to each other in series, and a voltage V2-V1 between end portions of the serial connections becomes the output voltage.

The configuration of the piezoelectric conversion portion 30 will be described.

The main component of the first electrode 32 is not particularly limited, and metals or metal oxides such as Au, Pt, Ir, $IrO_2$, $RuO_2$, $LaNiO_3$, and $SrRuO_3$ and combinations thereof are exemplified.

The main component of the second electrode 36 is not particularly limited, and the materials exemplified in the description of the first electrode 32, electrode materials that are used in ordinary semiconductor processes such as Al, Ti, Ta, Cr, and Cu, and combinations thereof are exemplified.

The piezoelectric film 34 is not particularly limited, but one kind or a plurality of kinds of perovskite-type oxides represented by General Formula (P) can be preferably used.

$$\text{General Formula } ABO_3 \qquad (P)$$

(In the formula, A represents an A site element and at least one element including Pb, B represents a B site element and at least one element selected from the group consisting of Ti, Zr, V, Nb, Ta, Cr, Mo, W, Mn, Sc, Co, Cu, In, Sn, Ga, Zn, Cd, Fe, Ni, and a lanthanide element, and O represents an oxygen atom. The standard of the molar ratio A:B:O is 1:1:3, but this molar ratio may deviate in a range in which a perovskite structure can be formed.)

Particularly, a perovskite-type oxide referred to as so-called lead zirconate titanate (PZT) or Nb-doped lead zirconate titanate (Nb-PZT) represented by $Pb(Zr_y, Ti_z, Nb_{1-y-z})O_3$, $0<y<1$, $0<z<1$ is preferred. Particularly, Nb-PZT in which, in $Pb(Zr_y, Ti_z, Nb_{1-y-z})O_3$, $0.06<1-y-z<0.14$, that is, the molar ratio Nb/(Zr+Ti+Nb) is more than 0.06 and less than 0.14 is preferred.

In the case of forming a Nb-PZT film using a vapor growth method such as a sputtering method, it is possible to obtain a film in a state of being polarized in a state of immediately after the formation of the film. Therefore, after the formation of the film, a polarization treatment is not necessary, which is preferable.

The thicknesses of the first electrode 32 and the second electrode 36 are not particularly limited and are, for example, approximately 200 nm. The film thickness of the piezoelectric film 34 is not particularly limited as long as the film thickness is 10 µm or less and is generally 1 µm or more and, for example, 1 to 5 µm.

Figure 5:
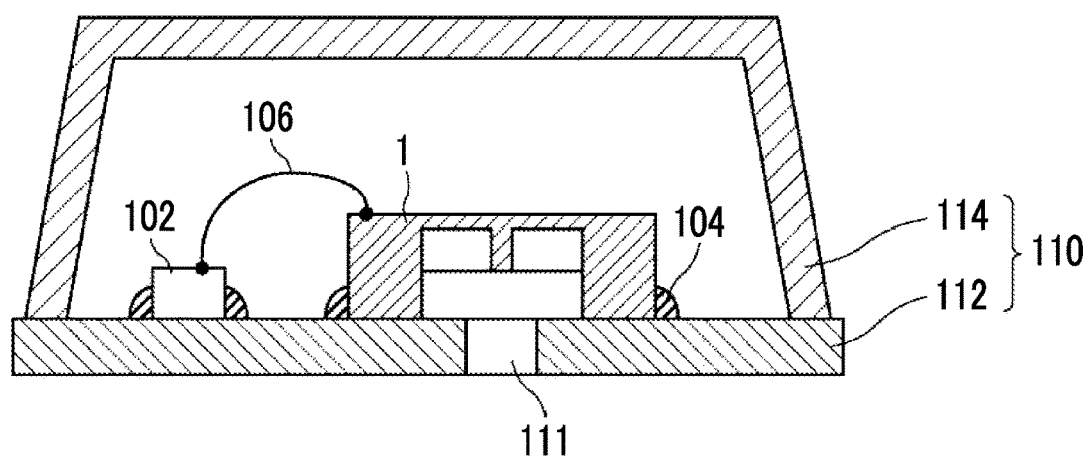
FIG. 5 is a cross-sectional view showing a schematic configuration of a microphone including the piezoelectric microphone chip.

FIG. 5 shows a piezoelectric microphone 100 including the piezoelectric microphone chip 1 (hereinafter, referred to as the chip 1). In FIG. 5, the configuration of the chip 1 is shown in a simplified manner.

The piezoelectric microphone 100 includes the chip 1 in a package 110 including a sound collection hole 111. In the package 110, an amplifier for signal amplification 102 that is connected to the signal detection circuit and the like are also included. The sound collection hole 111 in the MEMS microphone generally has a circular shape having a diameter of approximately 0.25 mm to 1 mm.

Piezoelectric microphones may include a single sound collection hole 111 or a plurality of sound collection holes, but the microphone chip of the embodiment of the present invention includes only one sound collection hole 111 and is highly effective in a case where the sound collection hole is sufficiently smaller than a region in which the plurality of diaphragms is formed (diaphragm array region). For example, in a case where the size of the diaphragm array region is represented by La, the size of each diaphragm is represented by Ld, and the diameter of the sound collection hole is La–Ld or less, there is a possibility that one or more cavities may be blocked at the time of the occurrence of positional deviation of a distance of Ld/2. Therefore, in a case where the diameter of the sound collection hole is La–Ld or less, it is possible to say that the effect of the present invention is large. Here, the size of the diaphragm array region refers to a long side in a case where the diaphragm array region is rectangular, a diameter in a case where the diaphragm array region is circular, and the maximum length in a case where the diaphragm array region has a penta- or higher-gonal shape or other shapes. Similarly, the size of the diaphragm refers to a long side in a case where the diaphragm is rectangular, a diameter in a case where the diaphragm is circular, and the maximum length in a case where the diaphragm has a penta- or higher-gonal shape or other shapes.

The chip 1 is mounted in a position, in which the outer edge support portion 22 surrounds the sound collection hole 111, in a base board 112 having the sound collection hole 111 of the package 110 using an adhesive 104. The amplifier for signal amplification 102 is also mounted on the base board 112 using the adhesive 104, and the signal detection circuit of the chip 1 and the amplifier for signal amplification 102 are electrically connected to each other using a bonding wire 106. The package 110 is sealed by a metal lid 114 that covers the base board 112, the chip 1 mounted on the base board 112, and the like.

The size of a sound collection hole in an ordinary microphone package is as small as approximately 0.5 mm in diameter. A problem that may be caused in a case where a chip having diaphragm structures in an array shape is mounted in a package and the effect of the microphone chip of the embodiment of the present invention will be described with reference to FIG. 6.

As a comparative example, a chip 121 in which a separation support portion 124 that separates a plurality of diaphragms has the same thickness as an outer edge support portion 122 and, as the present invention, the chip 1 of the first embodiment shown in FIG. 1A to FIG. 1C will be studied.

In a case where the comparative example of the chip 121 is disposed in a right mounting position relative to a sound collection hole 111 (Pattern P3 in FIG. 6), there is no particular problem, and it is possible to obtain an effect of the inclusion of a plurality of diaphragm structures. On the other hand, in a case where deviation occurs in the mounting position of the chip 121 (Pattern P4 in FIG. 6), some of cavities 126a are blocked by the separation support portion 124 and the base board 112. Therefore, a sound pressure Sp is incapable of entering the cavity 126a, and a situation in which the sound pressure detection function does not work may happen. At this time, only part of the plurality of diaphragms in the chip 121 detect sound pressures, and thus the signal intensity decreases, and a decrease in S/N is caused. In a case the separation support portion 124 has the same length as the outer edge support portion 122 as described above, the number n of diaphragms arrayed increases, and, in a case where the size of each rear surface cavity is decreased, several cavities are blocked due to even a slight alignment deviation of approximately several tens of micrometers.

Figure 6:
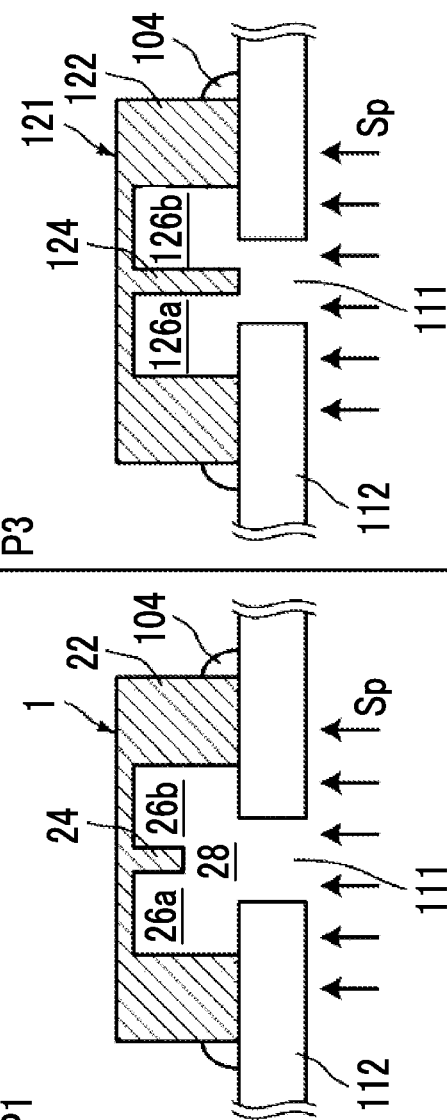
FIG. 6 is a view for describing an effect of the present invention.

In contrast, the chip 1 according to the embodiment of the present invention is capable of obtaining the effect of the inclusion of the plurality of diaphragms in the same manner as in a case where the chip is disposed at the right mounting position (Pattern P1 in FIG. 6) even in a case where positional deviation occurs (Pattern P2 in FIG. 6). In addition, as described above, due to the effect of a common back cavity, it is possible to obtain an effect for additional sensitivity improvement. The separation support portion 24 is formed to be thinner than the outer edge support portion 22 by at least 20 µm, and at least 20 µm is ensured as a height h from a surface of the base board 112 to a lower end of the separation support portion 24. Therefore, the sound pressure Sp from the sound collection hole 111 is equally applied to rear surface cavities 26a and 26b through the common cavity portion 28.

As described above, according to the chip 1 of the embodiment of the present invention, it is possible to prevent the blocking of the cavity attributed to the deviation of the mounting position. Furthermore, a high alignment accuracy is not required, and thus it becomes possible to manufacture microphones in a favorable yield.

Figure 7A:
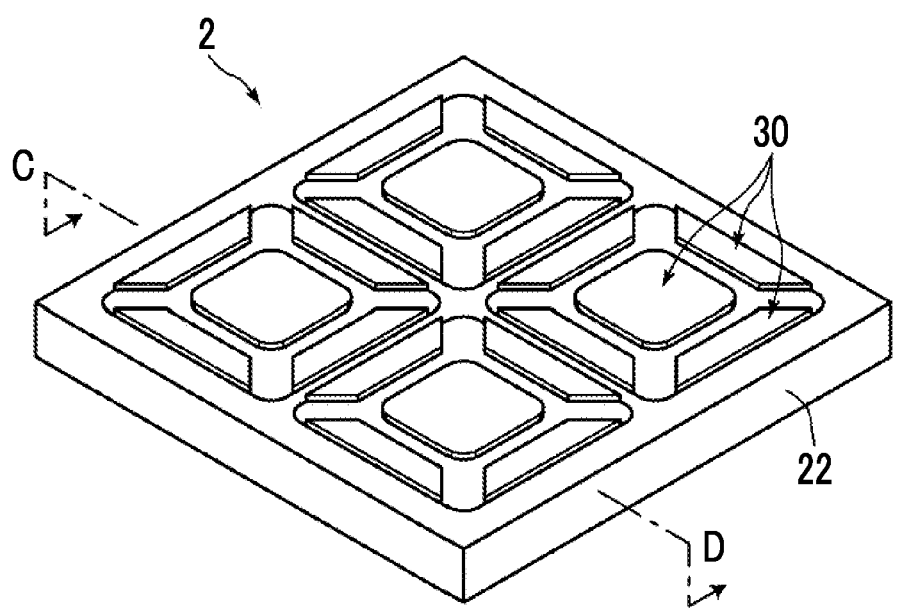
FIG. 7A is a perspective view showing a piezoelectric conversion element side of a piezoelectric microphone chip of a second embodiment.
Figure 7B:
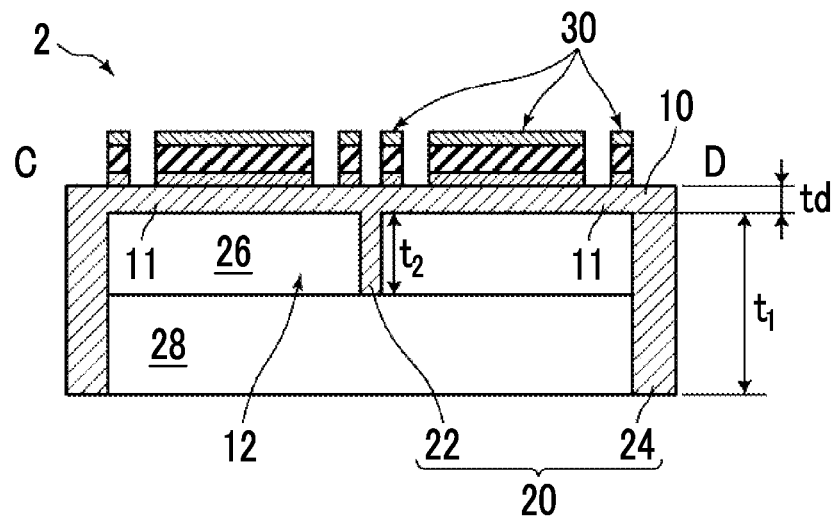
FIG. 7B is a cross-sectional view of the piezoelectric microphone chip of the second embodiment (a cross-sectional view in a direction of a C-D line in FIG. 7A).
Figure 7C:
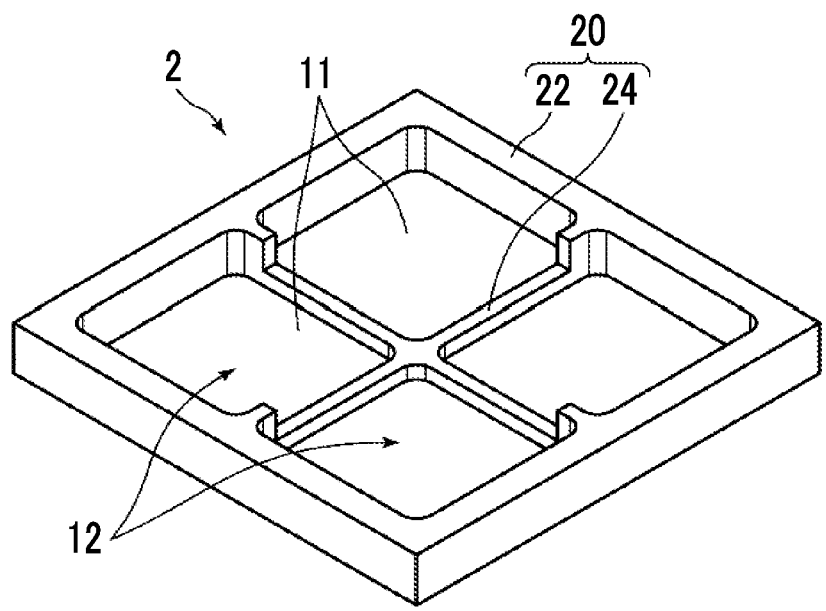
FIG. 7C is a perspective view showing a diaphragm support structure side of the piezoelectric microphone chip of the second embodiment.

FIG. 7A is a perspective view showing a surface of a piezoelectric microphone chip 2 of a second embodiment of the present invention. FIG. 7B is a cross-sectional view of the piezoelectric microphone chip 2 shown in FIG. 7A in a direction of a C-D line. In addition, FIG. 7C is a perspective view showing a rear surface of the piezoelectric microphone chip 2 shown in FIG. 7A. In FIG. 7A to FIG. 7C, the same configurational element as in the piezoelectric microphone chip 1 of the first embodiment will be given the same reference sign and will not be described in detail.

The piezoelectric microphone chip 2 is the same as the first piezoelectric microphone chip 1 in terms of the configuration of the diaphragm structure 12. The piezoelectric microphone chip is different from the first piezoelectric microphone chip 1 in terms of the fact that a plurality of the piezoelectric conversion portions 30 is provided on a single diaphragm 11. As shown in FIG. 7A, the present piezoelectric microphone chip 2 includes five piezoelectric conversion portions 30 on a single diaphragm 11.

Figure 8:
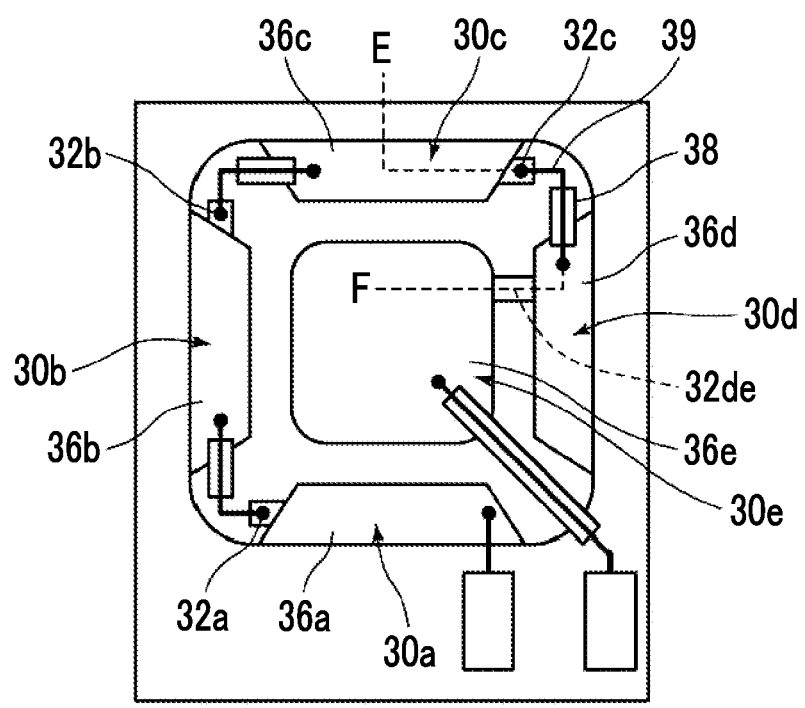
FIG. 8 is a plan view showing an electrode connection configuration of the plurality of piezoelectric conversion portions provided on a single diaphragm in the microphone chip of FIG. 7A of the second embodiment.

FIG. 8 shows an electrode connection structure of the five piezoelectric conversion portions 30 on a single diaphragm 11. In FIG. 8, in order to differentiate the piezoelectric conversion portions on a single diaphragm 11, reference signs 30a to 30e are given to the respective piezoelectric conversion portions. Similarly, the first electrodes and the second electrodes in the respective piezoelectric conversion portions are differentiated by giving reference signs a to e to the end. In a case where there is no need for differentiating the respective piezoelectric conversion portions, the piezoelectric conversion portions will be simply expressed as "piezoelectric conversion portion 30".

As shown in FIG. 8, the piezoelectric conversion portions 30a to 30e are connected together in series. A first electrode 32a of the piezoelectric conversion portion 30a and a second electrode 36b of the piezoelectric conversion portion 30b are connected to each other, a first electrode 32b of the piezoelectric conversion portion 30b and a second electrode 36c of the piezoelectric conversion portion 30c are connected to each other, and the piezoelectric conversion portions 30d and 30e are sequentially connected to each other. As described above, the outputs of the five piezoelectric conversion portions 30a to 30e provided on a single diaphragm 11 are added together, whereby it is possible to increase the signal intensity.

Figure 9:
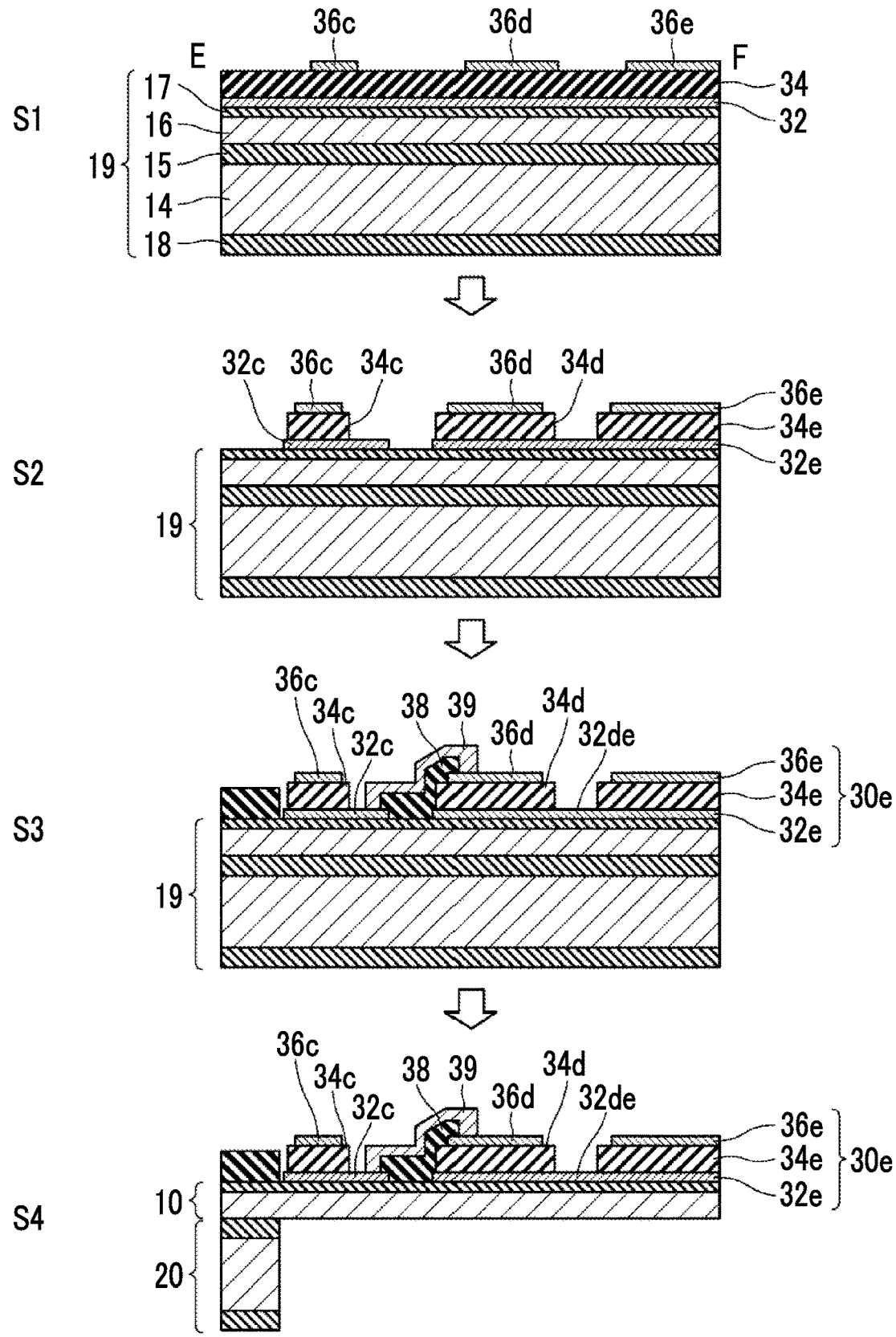
FIG. 9 is a view showing production steps of the piezoelectric conversion portions in the microphone chip of the second embodiment and a cross-sectional view in a direction of an E-F line in FIG. 8.

An example of a method for manufacturing the piezoelectric microphone chip 2 will be described with reference to FIG. 9. FIG. 9 is views showing manufacturing steps on an EF cross section of FIG. 8.

For portions configuring the diaphragm structure, an SOI substrate 19 including a handle layer 14, a box layer 15, and a device layer 16 is used. The SOI substrate 19 includes oxide films 17 and 18 on both surfaces.

The first electrode 32 and the piezoelectric film 34 are sequentially formed on the oxide film 17 on the surface of the SOI substrate 19 using a sputtering method. After that, the second electrode 36 is formed in a pattern (51). As a patterning method, a liftoff method, a wet etching method, or the like may be used.

Next, the piezoelectric film 34 and the first electrode 32 are etched in a pattern using a method such as dry etching (S2).

Next, an insulating film 38 is formed in a pattern, and a connection electrode 39 is formed in a pattern (S3).

Finally, the handle layer 14 is deep-etched (Deep RIE) from the rear surface of the SOI substrate 19, thereby producing a diaphragm structure (S4). The diaphragm structure is configured of the oscillation plate 11 and the diaphragm support structure 20.

The detail of the manufacturing step of the diaphragm structure (S4) will be described with reference to FIG. 10.

Figure 10:
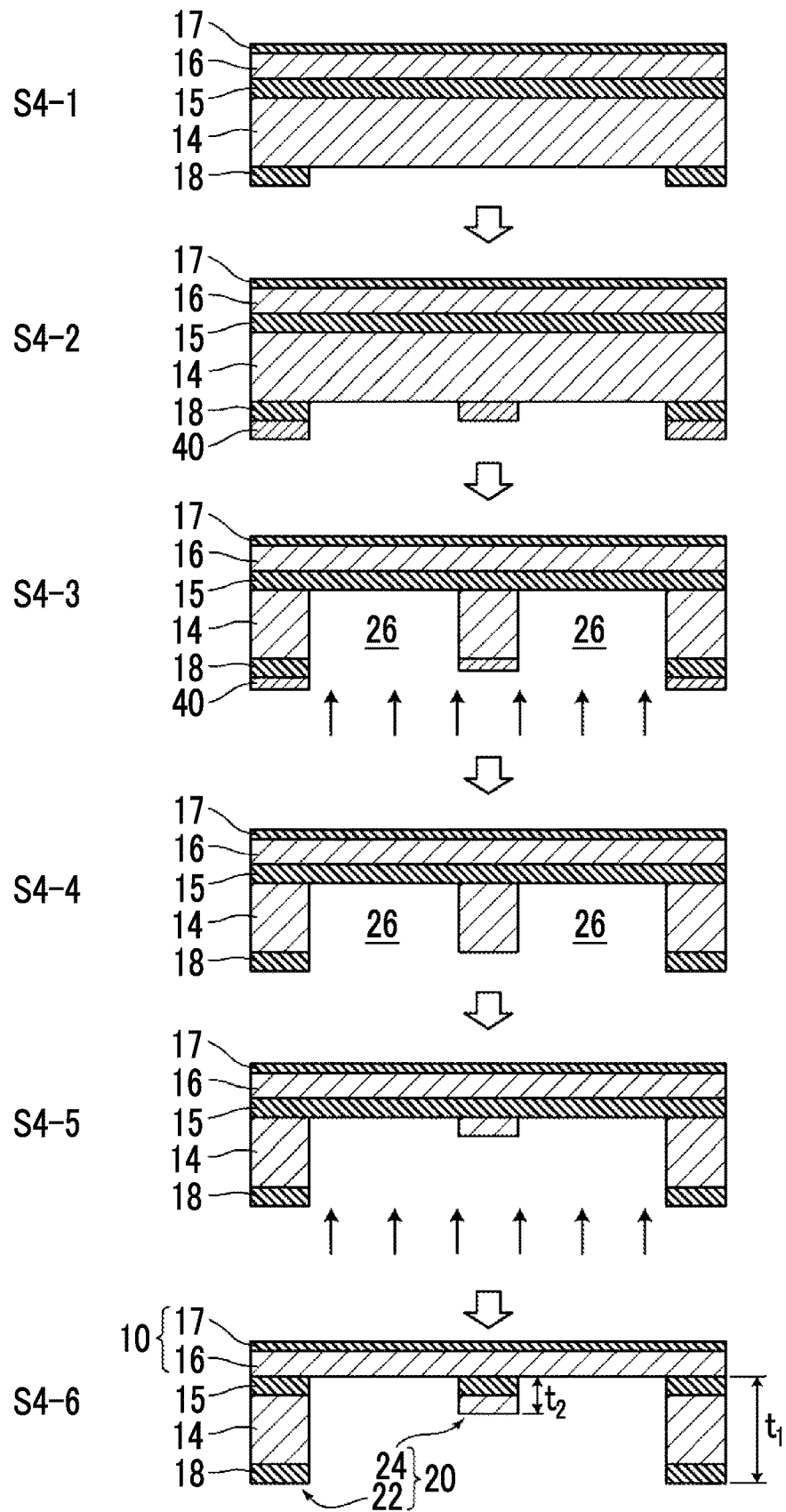
FIG. 10 is a view showing production steps of a diaphragm structure in the microphone chip of the second embodiment and shows only the diaphragm structure side in the cross-sectional view in a direction of the C-D line in FIG. 7A.

FIG. 10 shows the manufacturing step on the cross section of the piezoelectric microphone chip 2 shown in FIG. 7B. In FIG. 10, the piezoelectric conversion portions on the surface of the SOI substrate are not shown.

First, the oxide film 18 on the rear surface of the SOI substrate 19 is patterned. At this time, the oxide film 18 is patterned so as to remain only in a portion that serves as the outer edge support portion (S4-1).

After that, a photoresist 40 is formed in portions that serve as the outer edge support portion and the separation support portion on the rear surface of the SOI substrate 19 (S4-2).

The handle layer 14 made of Si is deep-etched using the photoresist 40 as a mask (S4-3).

After that, the photoresist 40 is removed (S4-4), and the handle layer 14 in a portion that serves as the separation support portion is deep-etched using the oxide film as a mask (S4-5). Furthermore, the box layer 15 is dry-etched, thereby forming the separation support portion 24 (S4-6). As described above, the diaphragm support structure having two thicknesses that are the thickness $t_1$ of the outer edge support portion 22 and the thickness $t_2$ of the separation support portion 24 can be obtained by carrying out etching in two stages.

The piezoelectric microphone chip 2 produced as described above is mounted on a package base board including a sound collection hole having a diameter of 0.5 mm using an adhesive, connected to an amplifier for signal amplification by wire bonding, and then sealed with a metal lid. Therefore, the microphone shown in FIG. 5 can be produced.

EXAMPLES

Hereinafter, the present invention will be described in detail using examples and comparative examples.

Microphones of Examples 1 to 4 and Comparative Examples 1 to 3 were produced.

Figure 11:
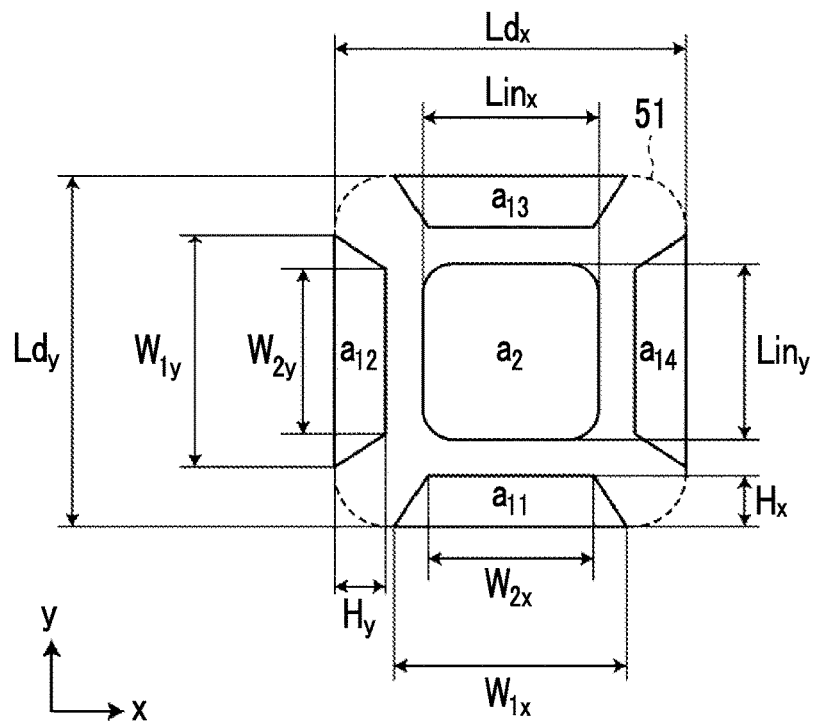
FIG. 11 is a view showing dimensional definitions of diaphragms and piezoelectric conversion portions in piezoelectric microphone chips of examples and comparative examples.

The definitions of the dimensions of a single diaphragm in piezoelectric microphone chips of examples and comparative examples and the dimensions of a plurality of piezoelectric conversion portions (second electrodes) provided on a single diaphragm are shown in FIG. 11. Here, a piezoelectric conversion portion $a_2$ provided in the central portion and four outside piezoelectric conversion portions $a_{11}$ to $a_{14}$ provided around the above-described piezoelectric conversion portion are provided.

An x-direction length of a diaphragm 51 is represented by $Ld_x$, and a y-direction length is represented by $Ld_y$. An x-direction length of the piezoelectric conversion portion $a_2$ directed toward the center is represented by $Lin_x$, and a y-direction length is represented by $Lin_y$. In the respective examples, the region of the piezoelectric conversion portion $a_2$ is further divided into four sections and caused to function as four piezoelectric conversion portions.

Among the piezoelectric conversion portions $a_{11}$ to $a_{14}$ provided around the piezoelectric conversion portion $a_2$, the two facing piezoelectric conversion portions $a_{11}$ and $a_{13}$, and $a_{12}$ and $a_{14}$ have a symmetric shape. In the shape, the length of a longer side, extending in the x direction, of the piezoelectric conversion portions $a_{11}$ and $a_{13}$ extending in the x direction is represented by $W_{1x}$, the length of a shorter side extending in the x direction is represented by $W_{2x}$, and the width in the y direction is represented by $H_x$. In addition, the length of a longer side, extending in the y direction, of the piezoelectric conversion portions $a_{12}$ and $a_{14}$ extending in the y direction is represented by $W_{1y}$, the length of a shorter side extending in the y direction is represented by $W_{2y}$, and the width in the x direction is represented by $H_y$.

A method for producing the microphone chip of each example is based on the above-described production steps.

A rear surface of the SOI substrate was etched, thereby forming a diaphragm structure. A region in which a diaphragm was formed (diaphragm array region) was common to all of the examples and set to 2 mm×2 mm. The thickness of an outer edge support portion in the diaphragm structure was set to $t_1$ (μm), the thickness of the separation support portion was set to $t_2$ (μm), and the thickness of the diaphragm was set to td (μm).

Each of the microphone chips of the respective examples produced in the above-described manner was mounted on a base board including a sound collection hole having a diameter of 0.5 mm using an adhesive, connected to an amplifier for signal amplification by wire bonding, and then sealed with a metal lid. Therefore, the microphone of each example was produced.

The respective dimensions in Examples 1 to 4 and Comparative Examples 1 to 3 were set as shown in Table 1 and Table 2. The number of diaphragms in Table 1 is the number of the diaphragm structures provided in the diaphragm array region. In addition, the number of serial connections in Table 2 is the total number of all of the piezoelectric conversion portions provided on the diaphragm array region.

TABLE 1

| | Size of diaphragm array region | Number of diaphragms | Dimensions of diaphragm (mm) | | Inside piezoelectric conversion portion (mm) | | Outside piezoelectric conversion portion (mm) | | | | | |
|---|---|---|---|---|---|---|---|---|---|---|---|---|
| | | | $Ld_x$ | $Ld_y$ | $Lin_x$ | $Lin_y$ | $W_{1x}$ | $W_{2x}$ | $H_x$ | $W_{1y}$ | $W_{2y}$ | $H_y$ |
| Example 1 | 2 mm | 2 | 0.975 | 2 | 0.5 | 1 | 0.75 | 0.55 | 0.1 | 1.5 | 1.1 | 0.2 |
| Example 2 | 2 mm | 4 | 0.975 | 0.975 | 0.5 | 0.5 | 0.75 | 0.55 | 0.1 | 0.75 | 0.55 | 0.1 |
| Example 3 | 2 mm | 4 | 0.975 | 0.975 | 0.5 | 0.5 | 0.75 | 0.55 | 0.1 | 0.75 | 0.55 | 0.1 |
| Example 4 | 2 mm | 16 | 0.475 | 0.475 | 0.25 | 0.25 | 0.37 | 0.27 | 0.05 | 0.37 | 0.27 | 0.05 |
| Comparative Example 1 | 2 mm | 1 | 2 | 2 | 1 | 1 | 1.5 | 1.1 | 0.2 | 1.5 | 1.1 | 0.2 |
| Comparative Example 2 | 2 mm | 4 | 0.975 | 0.975 | 0.5 | 0.5 | 0.75 | 0.55 | 0.1 | 0.75 | 0.55 | 0.1 |
| Comparative Example 3 | 2 mm | 4 | 0.975 | 0.975 | 0.5 | 0.5 | 0.75 | 0.55 | 0.1 | 0.75 | 0.55 | 0.1 |

TABLE 2

| | Number of serial connections between piezoelectric conversion portions | $t_1$ (μm) | $t_2$ (μm) | td (μm) | tp (μm) | fr (kHz) | S/N |
|---|---|---|---|---|---|---|---|
| Example 1 | 28 | 500 | 200 | 2 | 2 | 21 | 61 |
| Example 2 | 64 | 500 | 480 | 1.4 | 1.4 | 20.2 | 62 |
| Example 3 | 64 | 500 | 50 | 1.4 | 1.4 | 20 | 64 |
| Example 4 | 128 | 500 | 50 | 0.35 | 0.35 | 20.1 | 66 |
| Comparative Example 1 | 48 | 500 | 500 | 6.5 | 2 | 19.9 | 59 |
| Comparative Example 2 | 64 | 500 | 500 | 1.4 | 1.4 | 20.3 | 57 |
| Comparative Example 3 | 64 | 500 | 490 | 1.4 | 1.4 | 20.3 | 59 |

Here, a 30 nm-thick $T_1$ film was formed as an adhesive layer on a surface of an SOI substrate using a sputtering method at a substrate temperature of 350° C., and then a 150 nm-thick Ir electrode was formed as a first electrode. After that, a PZT film was formed in a thickness of tp (μm) on the first electrode using an RF sputtering device. As a film formation gas, a gas mixture of 97.5% of Ar and 2.5% of $O_2$ was used, and a material having a composition of $Pb_{1.3}((Zr_{0.52}Ti_{0.48})_{0.88}Nb_{0.10})O_3$ was used as a target material. The film formation pressure was set to 2.2 mTorr, and the film formation temperature was set to approximately 600° C.

Figure 12:
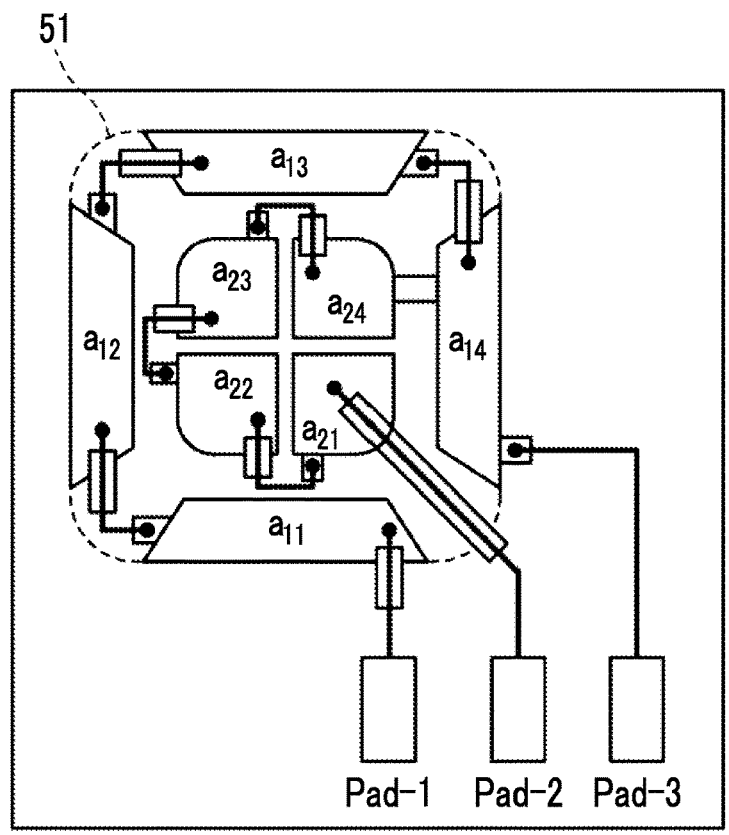
FIG. 12 is a plan view showing an electrode connection configuration of a plurality of piezoelectric conversion portions provided on a single diaphragm in the piezoelectric microphone chips of Examples 3 and 4.
Figure 13:
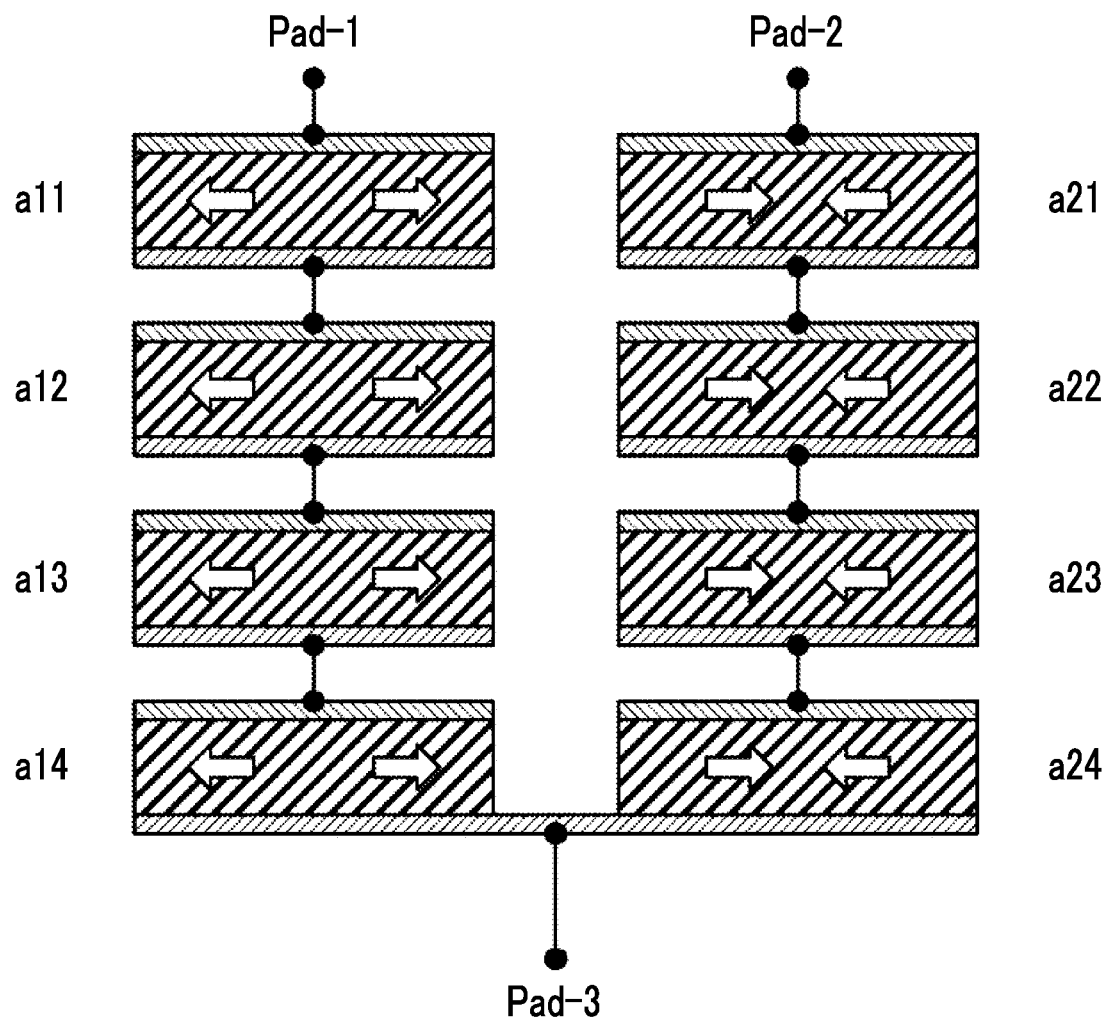
FIG. 13 is a view schematically showing the electrode connection structure of the piezoelectric conversion portions of FIG. 12.

FIG. 12 and FIG. 13 show an electrode connection state on the microphone chip of Comparative Example 1 and an equivalent circuit. In Comparative Example 1, a single diaphragm 51 was provided, and, on the diaphragm 51, the piezoelectric conversion portions $a_{11}$ to $a_{14}$ were disposed on the outside, and piezoelectric conversion portions $a_{21}$ to $a_{24}$ were disposed on the inside. In the piezoelectric conversion portions $a_{11}$ to $a_{14}$ on the outside and the piezoelectric conversion portions $a_{21}$ to $a_{24}$ on the inside, reverse polarity voltages were respectively generated by the incidence of a sound pressure. The electrodes in the respective piezoelectric conversion portions were connected to each other using the method for serial connection described regarding FIG. 3A and FIG. 3B so that the generated voltages of all of the piezoelectric conversion portions $a_{11}$ to $a_{14}$ and $a_{21}$ to $a_{24}$ were added together.

Figure 14:
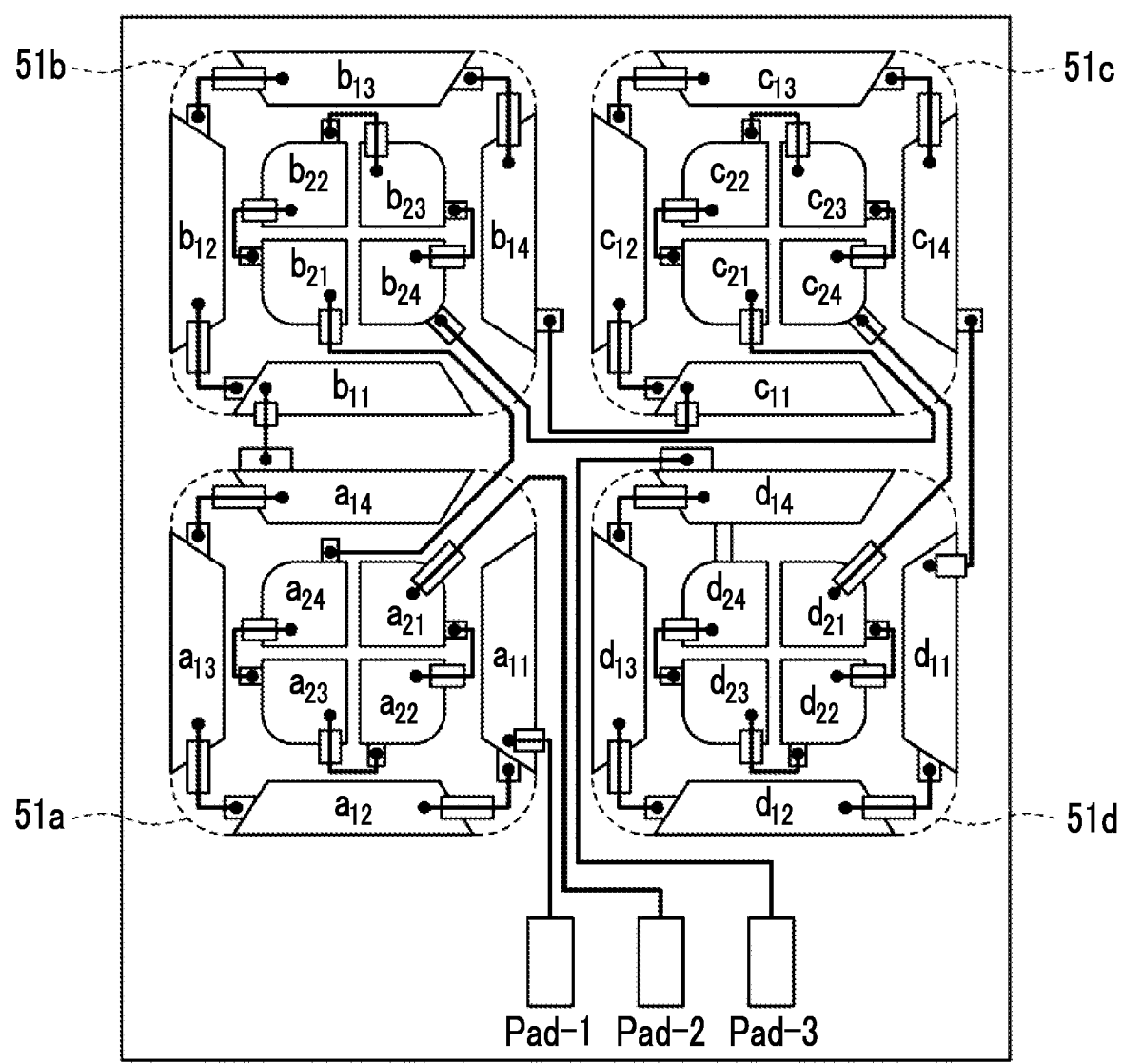
FIG. 14 is a plan view showing an electrode connection configuration of a plurality of piezoelectric conversion portions provided on the plurality of diaphragms in the piezoelectric microphone chips of Examples 3 and 4.
Figure 15:
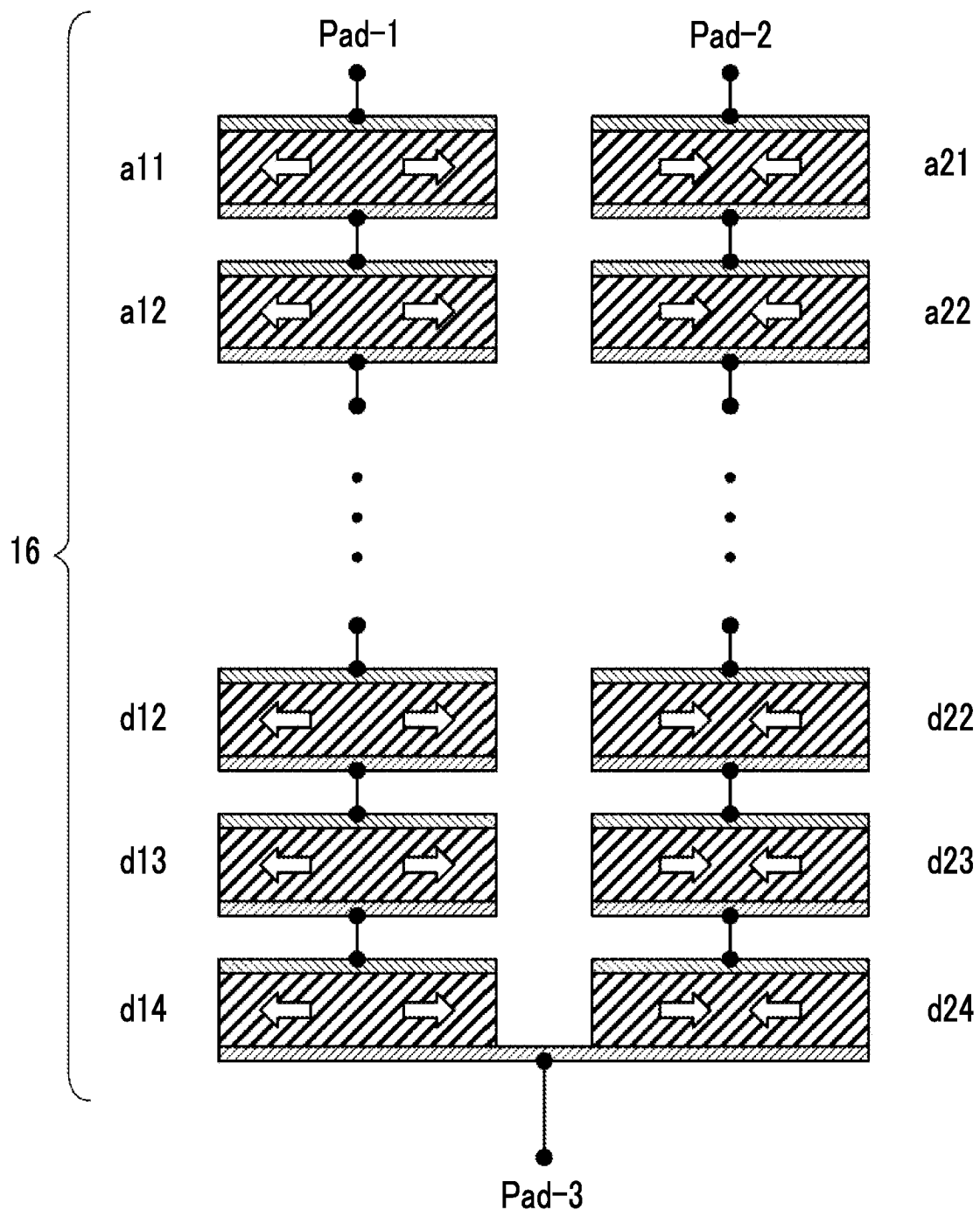
FIG. 15 is a view schematically showing the electrode connection structure of the piezoelectric conversion portions of FIG. 14.

FIG. 14 and FIG. 15 show electrode connection states and transmission circuits on the microphone chips of Examples 2 and 3 and Comparative Examples 2 and 3. In the microphone shown in FIG. 14, four diaphragms 51a to 51d were provided in the diaphragm array region, and, on each of the diaphragms 51a to 51d, four piezoelectric conversion portions were disposed on the outside, and four piezoelectric conversion portions were disposed on the inside. In the chip, a total of 64 piezoelectric conversion portions were provided, and all of the piezoelectric conversion portions were connected to each other in series in the same manner as described above.

In a case where a sound pressure was incidence through the sound collection hole, a detection voltage to which voltages generated in all of the piezoelectric conversion portions had been added was generated between Pad-1 and Pad-2. This detection voltage was amplified in an amplifier for signal amplification in the later stage and used as a sensor signal.

Pad-3 is an electrode intended to be used as a ground potential during a polarization treatment of the piezoelectric film. In Examples 1 to 4 and Comparative Examples 1 to 3, the Nb-added PZT films were formed using a sputtering method, and thus polarization was voluntarily aligned, and thus the polarization treatment was not required; however, for comparison with Comparative Example 4, the polarization treatment was prepared for convenience.

S/N was measured in the following manner.

An output terminal of the microphone was connected to a positive electrode-side input end of an operational amplifier configuring a non-inverting amplifier circuit having an amplification factor of 10 times. The frequency characteristic of a voltage signal $V_{out}$ output from an output terminal of the operation amplifier was read using an impedance analyzer.

A signal S [dB] was obtained from the following equation by reading a voltage magnitude value $V_{out\_s}$ at 1 kHz in a case where a sound wave formed of a single sinusoidal wave having a frequency of 1 kHz and a sound pressure of 1 Pa (sound pressure level=94 dB) was incident on a microphone using the impedance analyzer.

$$S = 20 \times \log_{10}(V_{out\_s})$$

A noise N [dB] was calculated from the following equation using a value of the frequency characteristic of a voltage signal output from the output terminal in a soundless environment, which was read using the impedance analyzer, as $V_{out}(f)$.

$$V_{out\_noise} = \sqrt{\int_{f_1}^{F1}\{F_{out}(f)A(f)\}^2 df}$$

$$N = 20 \times \log_{10}(V_{out\_noise})$$

Here, $f_1$ is 100 Hz, $f_2$ is 20 kHz, and A(f) is the weight of an acoustic A characteristic.

A resonant frequency fr [kHz] was determined by, for example, inputting a white noise driving signal to the output terminal of the microphone and observing the oscillation of a diaphragm portion by laser Doppler measurement.

S/N obtained by the above-described measurement and the resonant frequency fr are shown in Table 2.

From the comparison between Comparative Example 1 and Examples 1 to 4, a result that S/N as the microphone further improves as the number of the diaphragms increases was obtained. This is considered to be because the plurality of diaphragm structures was provided, and thus it was possible to decrease the elastic compliance of each diaphragm, and the sound-electric energy conversion efficiency increased.

In Comparative Example 2 in which the thickness of the separation support portion was the same as that of the outer edge support portion, S/N was lower than those in Examples 2 and 3 in which the other configurational conditions were the same. This was because, at the time of mounting the microphone chip in the package, due to the alignment deviation of the chip with respect to the sound collection holes in the microphone of Comparative Example 2, two of the rear surface cavities of the four diaphragms were blocked. In contrast, in the microphones of Examples 2 and 3, the separation support portions were shorter (thinner) than the outer edge support portions, and the rear surface cavities were not blocked, and thus a high S/N could be obtained.

The size of the sound collection hole in an ordinary microphone package is as small as approximately 0.5 mm in diameter. Therefore, in a case where the number of diaphragms arrayed increases and the size of each rear surface cavity decreases, several cavities are blocked due to even a slight alignment deviation of approximately several tens of micrometers. Here, even in a case where a multi-diaphragm structure is provided by forming a structure in which the separation support portion is formed to be shorter than the outer edge support portion as in the examples of the present invention, it is possible to prevent cavities from being blocked due to the deviation of the mounting position, and it is possible to maintain sensitivity.

Here, a result of studying an appropriate range of the thickness $t_2$ of the separation support portion will be described.

Figure 16:
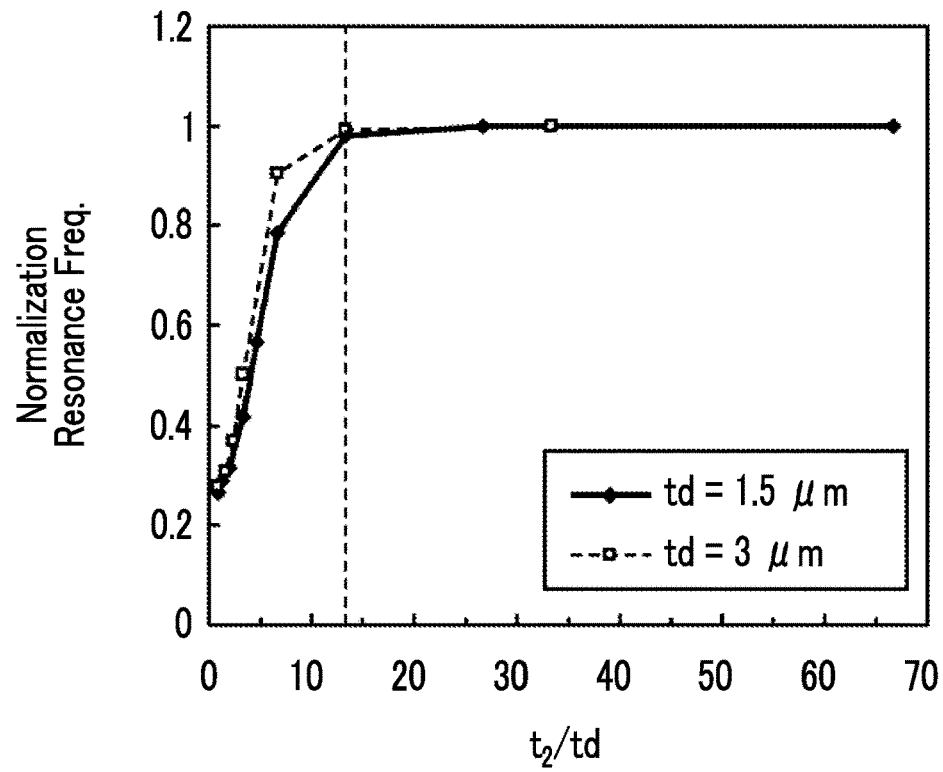
FIG. 16 is a view showing a relationship between a ratio of a separation support portion thickness to a diaphragm thickness and a resonant frequency.

In a case where $t_2$ is too large, the coupling between the cavities on the rear surfaces of the respective diaphragms become insufficient after mounting, and thus the air in the cavities does not function as a hard spring, the displacement of the diaphragms is impaired, and the sensitivity decreases. Conversely, in a case where $t_2$ is too small, the function as a frame that holds the respective diaphragms further degrades as the thickness of the separation support portion becomes closer to the thickness of the diaphragm. Therefore, all of the diaphragms oscillate in an integrated manner. In a case where all of the diaphragms oscillate in an integrated manner, a decrease in the resonance frequency is caused, and it is not possible to realize a microphone as designed. In FIG. 16, a calculation result of the relationship between a ratio $t_2/td$ of the thickness $t_2$ of the separation support portion to the thickness td of the diaphragm and the primary resonant frequency of the diaphragm in a case where the thickness td of the diaphragm is 1.5 μm and 3 μm using a finite element method is plotted. In FIG. 16, the vertical axis indicates a resonant frequency standardized by a resonant frequency in a case where $t_2$ is sufficiently thicker than td and the separation support portion reliably functions as a frame. As a result of carrying out simulation in which the width of the separation support portion was increased three times in the same time, almost the same tendency was obtained.

According to a graph shown in FIG. 16, it is found that a decrease in the resonance frequency can be suppressed to be 5% or less by satisfying $t_2$13.3×td. This tendency did not change even in a case where the dimension Ld of one diaphragm was changed in a range of 2.0 mm or less (refer to FIG. 17). The size of a chip in an ordinary MEMS microphone is in a range of 1 mm×1 mm to 2 mm×2 mm, and Ld does not exceed 2.0 mm.

Figure 17:
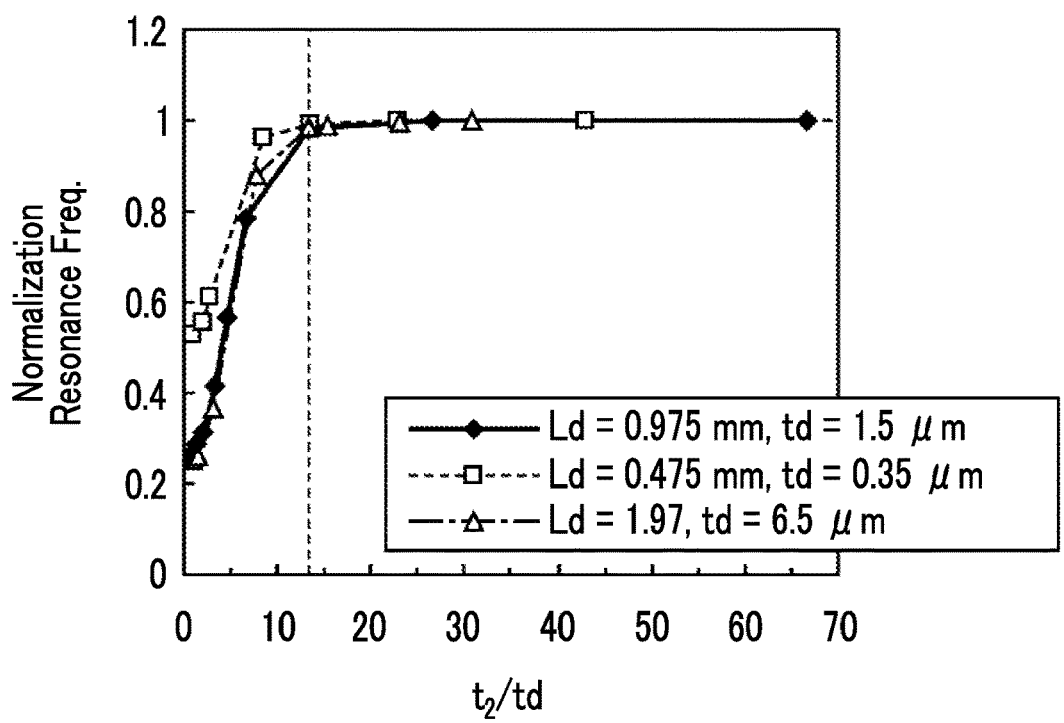
FIG. 17 is a view showing the relationship between the ratio of the separation support portion thickness to the diaphragm thickness and the resonant frequency.

Results of obtaining the ratio $t_2/td$ of the thickness $t_2$ of the separation support portion to the thickness td of the diaphragm in the case of changing Ld, td, and $t_2$ using the finite element method and the standardized resonant frequency are shown in Table 3. FIG. 17 is a graph in which the results in Table 3 are plotted.

TABLE 3

| Ld (mm) | td (μm) | $t_2$ (μm) | $t_2/td$ | Resonant frequency (Hz) | Standardized resonant frequency |
|---|---|---|---|---|---|
| 0.975 | 1.5 | 1.5 | 1.0 | 6134 | 0.27 |
| 0.975 | 1.5 | 2.0 | 1.3 | 6622 | 0.29 |
| 0.975 | 1.5 | 3.0 | 2.0 | 7194 | 0.31 |
| 0.975 | 1.5 | 5.0 | 3.3 | 9536 | 0.42 |
| 0.975 | 1.5 | 7.0 | 4.7 | 12962 | 0.57 |
| 0.975 | 1.5 | 10.0 | 6.7 | 17984 | 0.78 |
| 0.975 | 1.5 | 20.0 | 13.3 | 22452 | 0.98 |
| 0.975 | 1.5 | 40.0 | 26.7 | 22871 | 1.00 |
| 0.975 | 1.5 | 100.0 | 66.7 | 22923 | 1.00 |
| 0.475 | 0.4 | 0.35 | 1.0 | 10845 | 0.53 |
| 0.475 | 0.4 | 0.7 | 2.0 | 11345 | 0.55 |
| 0.475 | 0.4 | 1.0 | 2.9 | 12546 | 0.61 |
| 0.475 | 0.4 | 3.0 | 8.6 | 19768 | 0.96 |
| 0.475 | 0.4 | 4.7 | 13.4 | 20379 | 0.99 |
| 0.475 | 0.4 | 8.0 | 22.9 | 20541 | 1.00 |
| 0.475 | 0.4 | 15.0 | 42.9 | 20579 | 1.00 |
| 0.475 | 0.4 | 30.0 | 85.7 | 20586 | 1.00 |
| 0.475 | 0.4 | 80.0 | 228.6 | 20586 | 1.00 |
| 1.97 | 6.5 | 6.5 | 1.0 | 5675 | 0.25 |
| 1.97 | 6.5 | 10.0 | 1.5 | 5891 | 0.26 |
| 1.97 | 6.5 | 20.0 | 3.1 | 8249 | 0.37 |
| 1.97 | 6.5 | 50.0 | 7.7 | 19754 | 0.88 |
| 1.97 | 6.5 | 86.5 | 13.3 | 22143 | 0.98 |
| 1.97 | 6.5 | 100.0 | 15.4 | 22283 | 0.99 |
| 1.97 | 6.5 | 150.0 | 23.1 | 22461 | 1.00 |
| 1.97 | 6.5 | 200.0 | 30.8 | 22518 | 1.00 |
| 0.975 | 3.0 | 3.0 | 1.0 | 10527 | 0.28 |
| 0.975 | 3.0 | 5.0 | 1.7 | 13081 | 0.35 |
| 0.975 | 3.0 | 7.0 | 2.3 | 16259 | 0.43 |
| 0.975 | 3.0 | 10.0 | 3.3 | 22699 | 0.60 |
| 0.975 | 3.0 | 20.0 | 6.7 | 36260 | 0.96 |
| 0.975 | 3.0 | 40.0 | 13.3 | 37705 | 1.00 |
| 0.975 | 3.0 | 100.0 | 33.3 | 37795 | 1.00 |

In a case where the difference between $t_1$ and $t_2$ is smaller than 20 μm as in Comparative Example 3, coupling portions between the cavities become narrow, the impedance increases, and the output voltage decreases. Therefore, it was concluded that the thickness of the separation support portion is appropriately set in a range of $13.3 \times td \leq t_2 \leq t_1 - 20$ μm.

<Verification of Piezoelectric Film>

As Examples 5, 6, and 7, microphone chips in which the configuration was the same as in Example 2 and only the composition of the piezoelectric film was changed were produced and respectively combined into packages, thereby producing microphones. The amount of Nb added to PZT was set to 6% in Example 5, 14% in Example 6, and 0% (not added) in Example 7.

For the respective microphones, the resonant frequencies and S/N's were measured in the same manner as in the above-described examples. The measurement results are shown in Table 4.

Here, a change in S/N depending on the presence or absence of the polarization treatment on the PZT film is measured. The polarization treatment was carried out by using Pad-3 shown in FIG. 14 and FIG. 15 as a ground potential and applying a negative polarization voltage Vp to Pad-1 and Pad-2. The voltage for the polarization treatment was set to two different voltages of −20 V and −50 V, and the application time was set to five minutes.

TABLE 4

| | Amount of Nb added to PZT | fr (kHz) | S/N (no polarization treatment) | S/N (after −20 V polarization treatment) | S/N (after −50 V polarization treatment) |
|---|---|---|---|---|---|
| Example 3 | 11% | 20 | 64 | 64 | 64 |
| Example 5 | 6% | 20 | 59 | 60 | 60 |
| Example 6 | 14% | 20 | 63 | 63 | 63 |
| Example 7 | Not added | 20.1 | 20 or less | 31 | 48 |

In the microphone of Example 7 to which Nb was not added, S/N was extremely small in a state in which the polarization treatment was not carried out, and a polarization voltage of −50 V was required to obtain S/N high enough to withstand practical use. As the polarization voltage of an ordinary PZT thin film, an applied voltage of approximately −20 V is high enough. However, in the case of a configuration in which a plurality of piezoelectric conversion portions were connected to each other in series, as shown in FIG. 15, even in a case where the polarization voltage Vp for the polarization treatment is applied between Pad-1 and Pad-2, and Pad-3, only the polarization voltage divided by the number of serial connections is applied to each of the piezoelectric films as the applied voltage. Therefore, a sufficient polarization voltage cannot be applied.

In contrast, a microphone in which PZT containing Nb added in a range of 6 to 14% was used, S/N was high even without the polarization treatment, and the change in S/N depending on the presence or absence of polarization was extremely small. In Nb-added PZT, it is clear that the polarization directions are aligned in one direction immediately after the formation of a film, and thus the polarization treatment is not required, and a high output voltage can be obtained even in a case where the number of serial connections is increased.

What is claimed is:

1. A piezoelectric microphone chip comprising:
    a single thin plate;
    a diaphragm support structure that is provided on one surface of the thin plate and includes an outer edge support portion that supports an outer edge of the thin plate and a separation support portion that separates the thin plate into a plurality of diaphragms in association with the outer edge support portion;
    a single or a plurality of piezoelectric conversion portions formed by laminating a first electrode, a piezoelectric film, and a second electrode sequentially from a diaphragm side on each of the diaphragms; and
    a signal detection circuit that detects outputs from the piezoelectric conversion portions provided on the plurality of diaphragms,
    wherein a relationship among a thickness $t_1$ of the outer edge support portion, a thickness $t_2$ of the separation support portion, and a thickness td of the thin plate is $13.3 \times td < t_2 < t_1 - 20$ μm,
    wherein the signal detection circuit adds voltage outputs of the respective piezoelectric conversion portions of the plurality of piezoelectric conversion portions and detects a signal,
    wherein the voltage outputs of at least two piezoelectric conversion portions among the plurality of piezoelectric conversion portions are in opposite phases, and wherein the signal detection circuit has a conductive wire that electrically connects the first electrode of one of the two piezoelectric conversion portions and the first electrode of the other piezoelectric conversion portion, thereby adding the voltage outputs of the two piezoelectric conversion portions.

2. The piezoelectric microphone chip according to claim 1,
wherein the voltage outputs of at least two piezoelectric conversion portions among the plurality of piezoelectric conversion portions are in the same phase, and
the signal detection circuit has a conductive wire that electrically connects the second electrode of one of the two piezoelectric conversion portions and the first electrode of the other piezoelectric conversion portion, thereby adding the voltage outputs of the two piezoelectric conversion portions.

3. The piezoelectric microphone chip according to claim 1,
wherein the piezoelectric film is formed of a perovskite-type oxide represented by $Pb(Zr_y, Ti_z, Nb_{1-y-z})O_3$, $0.06 < 1-y-z < 0.14$.

4. A piezoelectric microphone comprising:
a package including one sound collection hole; and
the piezoelectric microphone chip according to claim 1 disposed in the package,
wherein the piezoelectric microphone chip is disposed at a position at which the sound collection hole is surrounded by the outer edge support portion.

* * * * *